United States Patent
Dierickx (10) Patent No.: US 11,463,634 B2
(45) Date of Patent: Oct. 4, 2022

(54) CHARGE DOMAIN BINNING IN A MOS PIXEL

(71) Applicant: Caeleste CVBA, Mechelen (BE)

(72) Inventor: Bart Dierickx, Edegem (BE)

(73) Assignee: CAELESTE CVBA, Mechelen (BE)

( * ) Notice: Subject to any disclaimer, the term of this patent is extended or adjusted under 35 U.S.C. 154(b) by 72 days.

(21) Appl. No.: 16/842,123

(22) Filed: Apr. 7, 2020

(65) Prior Publication Data

US 2021/0314504 A1 Oct. 7, 2021

(51) Int. Cl.
*H04N 5/347* (2011.01)
*H04N 5/374* (2011.01)
*H04N 5/343* (2011.01)
*H01L 27/146* (2006.01)

(52) U.S. Cl.
CPC .......... *H04N 5/347* (2013.01); *H04N 5/343* (2013.01); *H04N 5/374* (2013.01); *H01L 27/1464* (2013.01)

(58) Field of Classification Search
CPC ...... H04N 5/343; H04N 5/347; G01S 7/4865; G01S 7/4866; G01S 17/88–894; H01L 27/146
See application file for complete search history.

(56) References Cited

U.S. PATENT DOCUMENTS

| 7,564,022 B1* | 7/2009 | Dierickx | H04N 5/217 250/214 R |
| 2016/0073088 A1* | 3/2016 | Cohen | H01L 27/14812 348/46 |
| 2019/0019821 A1* | 1/2019 | Fotopoulou | G06T 7/521 |

FOREIGN PATENT DOCUMENTS

| EP | 2313927 B1 | 12/2015 |
| WO | 2018046688 A1 | 3/2018 |

* cited by examiner

*Primary Examiner* — Paul M Berardesca
(74) *Attorney, Agent, or Firm* — Workman Nydegger (57) ABSTRACT

An array of pixels for charge domain binning in a CMOS image sensor, to increase the readout sensitivity of such a sensor. The array of pixels comprises at least two pixels in a common substrate. At least one of said pixels is configured or configurable to function as a pixel of a first type with a first, higher, charge collecting capability, for collecting charges generated by radiation impinging on the substrate. At least another one of said pixels is configurable to function as pixel of a second type, with a second, reduced, charge collecting capability, and as a pixel of the first type.

15 Claims, 8 Drawing Sheets

CHARGE DOMAIN BINNING IN A MOS PIXEL

FIELD OF THE INVENTION

The present invention relates to the field of complementary metal oxide semiconductor (CMOS) image sensors. In particular the present invention relates to CMOS image sensors using charge domain binning to increase the sensitivity and to a method of readout of such a sensor.

BACKGROUND OF THE INVENTION

Binning is an advantageous approach for increasing the speed and reducing the power consumption of a readout of an array of pixels in an image sensor. When performing binning, the signals of a group of pixels are summed or averaged over the group of pixels and read out as a single signal. In particular, charge domain binning results in an increase in sensitivity and in a faster readout of an array of pixels. In such an approach, the charges of a group of pixels are added together, then converted into a corresponding voltage output. Typically, such group consists of 2×2 pixels, or 4×4, or 4×1, etc.

As an example of charge domain binning, WO2018/046688A1 discloses a plurality of shared pixel units, each of the pixel units comprising four sub-pixels connected in parallel, each having a photodiode and a transfer transistor. It is possible to read all of the sub-pixels of one pixel unit simultaneously, or to individually read out the sub-pixels. Reading the sub pixels simultaneously advantageously provides for a more sensitive pixel with more exposure surface area at the expense of lower pixel resolution.

It is a disadvantage of the charge domain binning method disclosed in WO2018/046688A1, that this method can only be applied to fairly simple and small (sub-)pixels. It cannot be applied to global shutter pixels and the overhead circuitry to realize the shared binning adds parasitic capacitance which reduces sensitivity and SNR.

SUMMARY OF THE INVENTION

It is an object of embodiments of the present invention to provide efficient charge domain binning in MOS pixels.

The above objective is accomplished by a device and a method in accordance with embodiments of the present invention.

In a first aspect, the present invention provides an array of pixels comprising at least two pixels in a common substrate. At least one of said pixels is configured or configurable to function as a pixel of a first type with a first, higher, charge collecting capability, for collecting charges generated by radiation impinging on the substrate. At least another one of said pixels is configurable to function (a) as a pixel of the first type and (b) as a pixel of a second type, with a second, reduced, charge collecting capability. The at least another one of said pixels is configurable to function as a pixel of both types, but obviously not as both types at the same time. At any moment in time, the at least another one of said pixels is configurable to function as a pixel of the first type, or as a pixel of the second type.

In accordance with embodiments of the present invention, a configuration in two modes is possible: a first mode wherein all pixels have the same charge collecting capability (all pixels are configured as pixels of the first type), which may be used for obtaining high resolution images, and a second mode where at least one pixel has a higher charge collecting capability (pixel of the first type), and at least one other pixel has a lower charge collecting capability (pixel of the second type), which may be used for charge binning.

In embodiments of the present invention, each of said at least two pixels comprises a photoreceptor charge collecting terminal in the common substrate. In particular embodiments, photoreceptor charge collecting terminal may form part of any of a photodiode, a pinned photodiode, a PIN photodiode, a Schottky photodiode, a photogate, a single-photon avalanche photodiode (SPAD), an avalanche photodiode (APD), or a photoresistor. The charge collecting terminal is for instance formed by an n-type volume in a p-type substrate in case of a photodiode in a p-type substrate and vice versa. Embodiments of the present invention also apply to pixels that have a photoresistor as photosensitive element, in which case the charge collecting terminal is formed by a highly doped volume. The other terminal is then formed by the common substrate.

In embodiments of the present invention, the at least two pixels are adapted for being configurable as a pixel of the first type (more collecting) or as a pixel of the second type (less collecting) under control of a voltage bias to be applied to the photoreceptor charge collecting terminal, wherein said voltage bias is either one of a predetermined voltage bias, or a programmable voltage bias, or a floating connection. In order to be not or less collecting, the non-collecting photoreceptor charge collecting terminals must be at an intermediate potential, which is, for an n-type collection volume in a p-type substrate, higher than the photoreceptor charge collecting terminal being forward biased towards the substrate, and lower than the bias of the photoreceptor charge collecting terminal.

The configuring of pixels to function as a pixel of the first type or as a pixel of the second type thus happens under pure electrical control. In particular embodiments, the electrical control of the configuration causes the widening of a depletion region of a pixel of the first type and/or the narrowing down of a depletion region of a pixel of the second type. The electrical control of pixels to function as a pixel of the first type (charge collecting) or of the second type (charge non-collecting) can be applied at will, individually per pixel, or per row or column if pixels are arranged in a grid.

The voltage bias may be applied directly or indirectly (e.g. via switches, charged capacitors, etc) to the photoreceptor charge collecting terminal.

An array of pixels in accordance with embodiments of the present invention may be a rectangular group of pixels, for instance 2×2, 3×3, 4×4, 1×3, 1×4, . . . . In practical implementations, an array of pixels will most often be much larger, e.g. 1080×1920 pixels, or 1440×2560 pixels, or larger.

An array of pixels in accordance with embodiments of the present may comprise at least one pixel configured as a pixel of the first type and a plurality of pixels configured as pixels of the second type, wherein said at least one pixel configured as a pixel of the first type is surrounded by a plurality of pixels configured as pixels of the second type. The at least one pixel configured as a pixel of the first type may for instance be surrounded by eight pixels configured as pixels of the second type.

An array of pixels in accordance with embodiments of the present invention, may comprise a plurality of pixels arranged in a 1- or 2-dimensional array, wherein each of said pixels configured as a pixel of the first type is surrounded by a plurality of pixels configured as pixels of the second type. In such implementations, no pixels at a border of the array are configured as pixels of the first type.

In particular embodiments of the present invention, each pixel of the array are configurable to function as a pixel of the first type and as a pixel of the second type. This provided most flexibility to the array. In alternative embodiments, some of the at least two pixels are fixedly configured to function as a pixel of the first type, and other pixels can be configured to function as a pixel of the first type or a pixel of the second type, depending on their control. In yet alternative embodiments of the present invention, also a combination is possible, in which some pixels are fixedly configured to function as a pixel of the first type, other pixels are fixedly configured to function as a pixel of the second type, and still other pixels are configurable to function as a pixel of the first type or as a pixel of the second type, depending on their control.

In an array in accordance with particular embodiments of the present invention, each of the at least two pixels, irrespective of being configured as a pixel of the first type or as a pixel of the second type, may be substantially equal.

In a second aspect, the present invention provides an image sensor comprising an array of pixels in accordance with embodiments of the first aspect of the present invention. In such image sensor according to embodiments of the second aspect of the present invention, pixels may be operated differently: some pixels may be operated to function as pixels of the first type—what would be called "normal" pixels, or charge collecting pixels —, and others may be operated to function as pixels of the second type, which are not (or less) charge collecting.

An image sensor according to embodiments of the present invention may be a complementary metal oxide semiconductor (CMOS) image sensor.

An image sensor according to embodiments of the present invention may be adapted for detecting backside radiation or frontside radiation.

In a third aspect, the present invention provides a method of operating an array of pixels in two different modes. The method comprises in a first mode, configuring all pixels of the array to function as pixels of a first type with a first, higher, charge collecting capability, for collecting charges generated by radiation impinging on the substrate, and in a second mode, configuring at least one pixel of the array to function as a pixel of the first type, and configuring at least another one of the pixels to function as a pixel of a second type, with a second, reduced, charge collecting capability, so as to perform charge domain binning.

It is to be noted that no sequence is implied by the method described above: it only indicates that an array of pixels can be operated in two modes, which can be a first mode first, or in a second mode first.

A method in accordance with embodiments of the present invention comprises configuring a pixel to function as a pixel of the first type or as a pixel of the second type, by controlling a voltage bias, wherein the voltage bias is either one of a predetermined voltage bias, or a programmable voltage bias, or a floating connection.

A method in accordance with embodiments of the present invention may be performed on an array of pixels logically organized in row and columns, each pixel having a transfer transistor with a transfer gate, transfer gates of pixels in a same row being electrically connected to a transfer gate control wire, and pixels on a same column having a connection to a main supply via a column supply line. A row of pixels may be configured to function as pixels of the second type by biasing the transfer gate control wire for all pixels of that row such that the transfer transistors are made non-conductive. A column of pixels may be configured to function as pixels of the second type by leaving the supply line of the pixels on that column floating or biased at an intermediate bias between the main supply and a substrate bias. This way, a whole row and/or a whole column of pixels can be made not or less collecting. Where such rows and columns cross, the pixels are also not or less collecting.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, particular objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, directional terminology such as top, bottom, front, back, leading, trailing, under, over and the like in the description and the claims is used for descriptive purposes with reference to the orientation of the drawings being described, and not necessarily for describing relative positions. Because components of embodiments of the present invention can be positioned in a number of different orientations, the directional terminology is used for purposes of illustration only, and is in no way intended to be limiting, unless otherwise indicated. It is, hence, to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Definitions

In embodiments of the present invention "radiation" may be interpreted as radiation of any type. The radiation can be electro-magnetic or of particle nature. The radiation may for instance be X-rays or gamma rays, or radiation within the range between far infrared to ultraviolet such as for instance visible light. Alternatively, the radiation may be particles, including low or high energy electrons, photons, hadrons or other particles.

In embodiments of the present invention, the term "substrate" may include any underlying material or materials that may be used, or upon which a device, a circuit or an epitaxial layer may be formed. In particular embodiments, this "substrate" may include a semiconductor substrate such as e.g.

doped silicon, a gallium arsenide (GaAs), a gallium arsenide phosphide (GaAsP), an indium phosphide (InP), a germanium (Ge), or a silicon germanium (SiGe) substrate. The term "substrate" is thus used to define generally the elements for layers that underlie a layer or portions of interest, in particular for the present invention the charge collecting volume of a pixel. The substrate in embodiments of the present invention is conductive and continuous, in order to allow charge collection.

Semiconductor materials can be doped with dopant atoms. A heavily doped semiconductor material comprises $10^{18}$ dopant atoms/cm$^3$ or more, and a lightly doped semiconductor material comprises $10^{15}$ dopant atoms/cm$^3$ or less.

In the context of the present invention, a semiconductor substrate may be doped with dopants of a first type. Volumes of semiconductor material doped with dopants of the first type or of a second type, different from the first type, may be provided in the semiconductor substrate. The first type may for instance be p-type, and the second type may for instance be n-type. The invention is, however, not limited thereto, and in alternative embodiments the first type may for instance be n-type, and the second type may for instance be p-type. Volumes of, e.g. heavily doped, n-type material may be provided in a p-type substrate, for instance a lightly doped p-type substrate, thus for instance forming a photodiode. One may have the case when all (substrate and doped volumes) are of the same type, resulting e.g. in a n+ n– n+ structure being a photoresistor, or a collecting terminal of n-type, a substrate of n-type and a common substrate backside connection of p-type.

A depletion region is a region in semiconductor material which is free of majority charge carriers as these are pulled away by an electric field. A depletion region in the context of the present invention is a region formed across a pn-junction (collection junction). The size of the depletion region, measured substantially perpendicularly over the pn-junction, is called the depletion region width. This depletion region width can be changed by external factors, for instance by a bias voltage across the p-type and n-type terminal.

In the context of the present invention, it is beneficial, though not essential, that the depletion region of a collecting junction extends widely and overlaps (touches) with the depletion region of a neighboring junction. Widely extending depletion regions imply the use of high resistivity material, e.g. materials having a resistivity of typically 500 Ohm·cm or higher. However, the present invention is not limited to high resistivity material, and it is also possible to reach the effect in normal resistivity material, e.g. materials having a resistivity in the order of 5 to 20 Ohm·cm. Having a thick high resistivity material as compared to the pixel size is beneficial for the charge collection thus for the sensitivity. As an example only, not limiting to the present invention, for a pixel size (pixel pitch) of 15 μm, it is desired that the thickness of the layer in which charges are generated upon impinging of radiation be about 10 μm or more.

In the context of image sensors, binning is the readout of information of a group of pixels, whereby the signals of the group of pixels are summed or averaged and are read out as a single, "binned", signal. In the context of the present invention, such binning is performed in the charge domain. The purpose of binning in the charge domain is to collect photo charges of a small kernel (=repeated group) of pixels into a single charge packet, and reading it out in a single operation. This is different from voltage domain binning, whereby voltage output signals of a group of pixels are averaged on-chip to an average voltage signal; and it is different from digital domain binning, whereby the binning operation happens in the digital domain, after image acquisitions and analog-to-digital conversion.

Advantages of binning are faster and lower power readout of an imager. However, speed is exchanged for resolution. Charge domain binning, as in the present invention, shows the particular advantage that sensitivity [V·m$^2$/W·s] and noise equivalent flux are increased, which is not or to a lesser extent present in the other forms of binning.

In a first aspect, embodiments of the present invention relate to an array of pixels for charge domain binning of a CMOS image sensor to increase the readout sensitivity. The array of pixels comprises at least two pixels provided in a common substrate. Embodiments of the present invention also apply when the substrate is partially segmented or cut to prevent charge carriers to move between pixels, for instance in case of pixels that are separated by deep trench isolation. As long as diffusion or drift of charge carriers from one pixel to the other can still happen, the present invention applies.

In the array of pixels, at least one of the at least two pixels is configured or configurable to function as a pixel of a first type, with a first charge collecting capability, for collecting charges generated by radiation impinging on the substrate. At least another one of the at least two pixels is configurable to function as a pixel of a second type, with a second charge collecting capability and as a pixel of the first type. The first charge collecting capability is larger than the second charge collecting capability, or thus the second charge collecting capability is reduced compared to the first charge collecting capability. In the following description, pixels of the first type are called charge collecting pixels, while pixels of the second type are called charge non-collecting pixels. This is done for the ease of understanding only, and does not refer to an actual situation in which the charge non-collecting pixels would not collect any charge at all. This would be the most preferred implementation, but in practice also charge non-collecting pixels will collect some charge, albeit a reduced amount.

Embodiments of the present invention thus provide a method to perform charge domain binning by configuring a number of pixels to function as pixels of the first type, i.e. to make the pixels charge collecting, and by configuring a number of pixels to function as pixels of the second type, i.e. to make the pixels charge non-collecting. The photo charges that are not collected by a charge non-collecting pixel move by drift or diffusion through the substrate, and are then collected by a charge collecting pixel.

Figure 1:
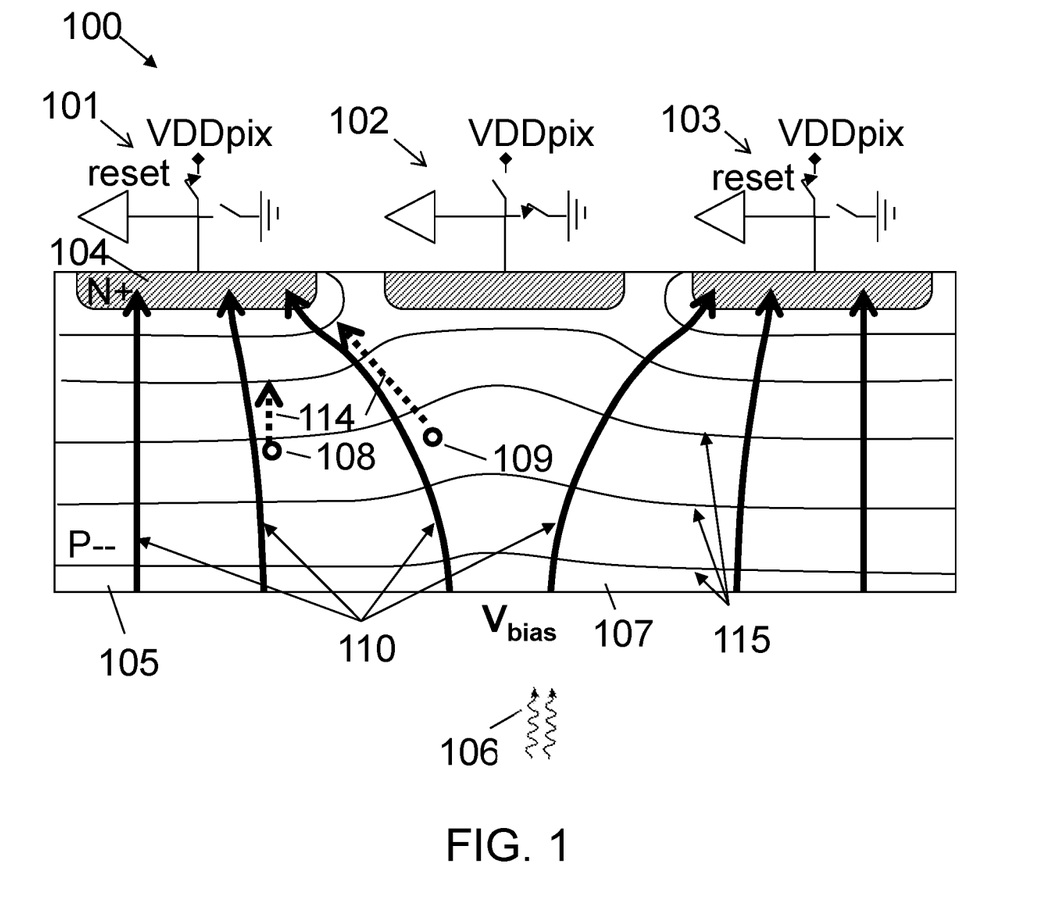
FIG. 1 schematically shows a cross section of an example of an array of pixels according to embodiments of the present invention, in which the configuration of the pixels is done by means of a fixed voltage bias applied to a charge collecting terminal of a photoreceptor.

A cross section of an example of an array of pixels 100 is illustrated in FIG. 1. In this example, the array of pixels 100 comprises a first pixel 101, a second pixel 102, and a third pixel 103. At least one pixel of the array of pixels, for example the first pixel 101, is configured to function as a charge collecting pixel. At least another one of the array of pixels, for example the second pixel 102, is configured to function as a charge non-collecting pixel. The third pixel 103 in this example, is configured to also function as an extra charge collecting pixel. At least the second pixel 102, but in the example illustrated all pixels 101, 102, 103 are configurable to function as a charge collecting pixel and as a charge non-collecting pixel. The configuration of the pixels may be done once, after which particular pixels function as a charge collecting pixel, and other pixels function as a charge non-collecting pixel; or pixels may be configured in a first configuration first, and reconfigured in another configuration later. Such reconfiguration may be done as many times as needed or desired, and when needed or desired. The array of pixels 100 may further comprise additional pixels (not shown in FIG. 1), each configured or configurable to function as a charge collecting pixel, and at least some of them configurable to function as a charge non-collecting pixel.

Each of the pixels of the array 100 comprises a photosensitive element, i.e. an element that is sensitive to and able to collect generated photocharges. The photosensitive element may for example be a photodiode, as shown in FIG. 1, but the present invention is not limited thereto. In alternative embodiments of the present invention, the photosensitive element may for instance be a photoresistor, or a vacuum based device using a photocathode.

A photodiode is a semiconductor component that converts impinging radiation into an electrical current. The photodiode may for example be a simple pn-junction, a pinned photodiode, a buried diode, a PIN photodiode, a Schottky photodiode, a photogate, a single-photon avalanche photodiode (SPAD), or an avalanche photodiode (APD), or the like. The photodiodes may be made of any suitable type of semiconductor material, e.g. silicon or germanium, or any suitable type of semiconductor alloy, e.g. II-VI or III-V type semiconductor materials. Different pixels in the array of pixels 100 may comprise the same or different types of photodetectors, or for example the same or different types of photodiodes. For example, the first pixel 101 may comprise the same or a different type of photodiode than that of the second pixel 102, and than that of the third pixel 103, and than that of any other additional pixels in the array of pixels 100.

As illustrated in FIG. 1, the first pixel 101 may for example comprise a first pn-junction. Further, the second pixel 102 may for example comprise a second pn-junction. Each of the first pn-junction and the second pn-junction comprise a first doped volume 104 which functions as a charge collection volume or charge collecting terminal, e.g. an n-type doped volume, and a second doped volume 105, e.g. a p-type doped volume.

In the following description, a p-type substrate 107 is taken as the second doped volume 105, for reasons of explanation only, with n-type photodiodes and nMOSFETS; but as stated before, this is not limiting for the present invention, and the substrate could be of n-type doping, with p-type photodiodes and pMOSFETS. Also intermediate forms can be envisaged, in which nMOSFETS or a mix of nMOSFETS and pMOSFETS are provided in n- or p-type epitaxial layers on p- or n-type substrates. A person skilled in the art would easily be able to convert the teaching of the invention in case p-type and n-type would be interchanged.

In some particular embodiments, the photodiode may comprise a plurality of doped charge collection volumes in an alternative configuration, with two or more similarly or differently doped volumes.

Each of the first doped volume 104 and the second doped volume 105 in any of the first pn-junction and in the second pn-junction comprises an unequal concentration of electrons and holes. For example, the first doped volume 104 (for the example of n-type) of the first pn-junction, has a concentration of electrons higher than the concentration of holes. Similarly, for example, the second doped volume 105 (for the example of p-type) of the first pn-junction, has the concentration of holes higher than the concentration of electrons. For example, the first doped volume 104 (n-type) of the first pn-junction may be heavily doped, having a concentration of dopant atoms of more than $10^{18}/cm^3$ and the second doped volume 105 (p-type) of the first pn-junction may be lightly doped, having concentration of dopant atoms below $10^{15}/cm^3$.

At every pn-junction, a depletion region is formed. The first pn-junction has a first depletion region, and the second pn-junction has a second depletion region. In the embodiments illustrated in FIG. 1 and FIG. 2 the depletion regions of charge collecting pixels are merged. This is different from the embodiment illustrated in FIG. 6, where charge collecting pixels have depletion regions which are separate from one another.

In the array of pixels 100 illustrated in FIG. 1, the first pn-junction is configured to be stronger reverse biased than the second pn-junction. This may be obtained, as an example only, for a p-type substrate, by applying a negative substrate bias $V_{bias}$ at the p-type substrate, e.g. −5V, a positive bias, e.g. 2V, at the first doped volume 104 of the first pixel 101 so as to configure it to function as a charge collecting terminal, and an intermediate bias, higher than the substrate bias but lower than the positive bias, e.g. 0V, at the first doped volume of the second pixel 102; the bending of the equipotential planes in the substrate, bends the electric field lines driving the charges to a neighboring pixel, so that this second pixel functions as a charge non-collecting pixel. The application of the substrate bias, the positive bias and the intermediate bias causes the first depletion region of the first pn-junction to cover more volume than the second depletion region of the second pn-junction.

The first pixel 101 and the second pixel 102 are configurable and, in the example illustrated, reconfigurable to function as a charge collecting pixel or as a charge non-collecting pixel by applying and reapplying the positive bias and intermediate bias to the first and second pixels, as many times as needed. The first pixel 101 and the second pixel 102 are configured to operate differently, at least in a charge binning mode, i.e. if the first pixel 101 is configured to function as a charge collecting pixel, then the second pixel 102 should be configured to function as a charge non-collecting pixel, or if the first pixel 101 is configured to function as a charge non-collecting pixel, then the second pixel 102 should be configured to function as a charge collecting pixel. When not in charge binning mode, all pixels are configured equal, as charge collecting pixels.

In the embodiment illustrated in FIG. 1, the first doped volume 104 of the first pixel 101 and of the third pixel 103 is connected to a first voltage bias, e.g. positive supply voltage VDDpix, while the first doped volume of the second pixel is connected to second voltage bias, e.g. ground voltage. The substrate 107 is connected to a third voltage bias, e.g. negative substrate bias $V_{bias}$. Therefore, the pn-junctions of all pixels are reverse biased, but in view of the first voltage bias being larger than the second voltage bias, VDDpix>0, the reverse biasing of the first and third pixels thus being stronger than the reverse bias of the second pixel, the pn-junctions of the first pixel 101 and of the third pixel 103 are wider than the pn-junction of the second pixel 102. The difference in width of depletion regions of pixels connected to the first voltage bias, e.g. positive supply voltage VDDpix, compared to pixels connected to the second voltage bias, e.g. ground, leads to a distribution of equipotential lines 115 (equipotential planes) as schematically illustrated in FIG. 1. Electric fields are present in the substrate, and they are oriented locally perpendicular to the equipotential lines 115 as illustrated by means of the arrows 110.

Further, in FIG. 1, radiation 106 e.g. a photon, impinging on the substrate 107 generates a first electron 108 and a first hole (not shown) in the first pixel 101, and generates a second electron 109 and a second hole (not shown) in the second pixel 102. The first electron 108 is moved, under influence of the electric field (as schematically illustrated by arrows 110), towards the first doped volume 104 of the first pixel 101. In other words, the first electron 108 is collected by the first pixel 101. The first hole (not shown) also moves under influence of the electric field 110, but in the opposite direction, towards the negative bias voltage Vbias. Further, the second electron 109, although generated in the second pixel feels an electric field towards the first pixel, as illustrated by the electric field lines 110, and will be collected by the first pixel. The second hole (not shown) also moves under influence of the electric field 110, but in the opposite direction, towards the negative bias voltage $V_{bias}$. A limited fraction of electrons generated in the second pixel, would be collected by this pixel, depending on the actual electrical field it feels. The radiation 106 may for example be a frontside radiation (not shown), i.e. radiation applied at that side of the substrate where the pixels are actually provided, or a backside radiation 106 i.e. radiation applied at the side of the substrate opposite to the side where the first doped volumes and other circuitry elements are actually provided, as shown in FIG. 1.

The first width of the first depletion region in the first pixel 101 is controlled by the voltage difference between the first voltage bias, e.g. VDDpix, and the substrate bias, e.g. $V_{bias}$. The second width of the second depletion region in the second pixel 102 is controlled by the voltage difference between the second voltage bias, e.g. GND, and the substrate bias, e.g. $V_{bias}$. The first voltage bias, the second voltage bias, and the third voltage bias may be either a predetermined voltage bias, such as VDDpix, GND, and $V_{bias}$, or a programmable voltage bias, or a floating connection.

For example in FIG. 1, the first voltage bias of the first pixel 101 is VDDpix, and the second voltage bias of the second pixel 102 is GND. The third voltage bias $V_{bias}$ is shared between the first pixel and the second pixel, wherein $V_{bias}$ is essentially smaller than the first voltage bias, e.g. VDDpix, such that a first electric field 110 is generated across the first pn-junction. A second electric field (not shown) is generated across the second pn-junction in a similar manner, by means of the second voltage bias and the third voltage bias. However, since the second depletion region is essentially narrower than the first depletion region, the second electric field has less influence on the generated photocharges, and can in an optimal case be neglected. The first electric field 110 results in the movement of e.g. the first electron 108 and the second electron 109 indicated by the arrows 114. The first doped volume of the charge collecting pixel collects a large fraction of the charge that would normally (i.e. if both pixels would be biased to a same first and second voltage bias) flow to the first doped volume of the charge non-collecting pixel.

For p-type substrates with n-type first doped volumes, the first voltage bias may for instance be 1 to 3 Volts, the second voltage bias may for instance be −0.5 to +0.5 V, and the third voltage bias may for instance be about 0 Volts or lower e.g. −5 or −10V.

Figure 2:
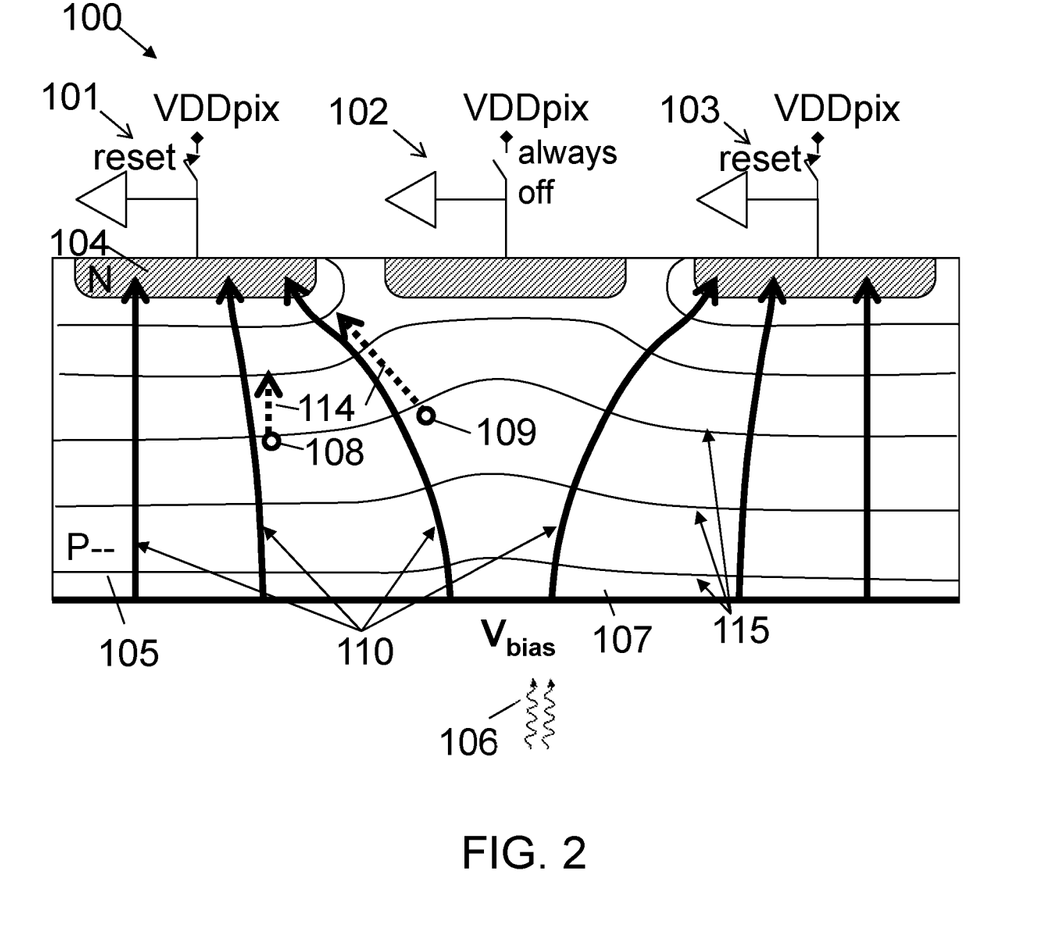
FIG. 2 schematically shows a cross section of an example of an array of pixels according to embodiments of the present invention, in which the configuration of a pixel of a first type is done by means of a fixed voltage bias, and the configuration of a pixel of a second type is done by leaving the charge collecting terminal of the photoreceptor floating.

FIG. 2 illustrates an embodiment which is closely similar to the one of FIG. 1 in terms of pixel parts, which is made clear by using same reference numbers as in FIG. 1 for indicating same pixel parts. The embodiment of FIG. 2 only differs from the embodiment of FIG. 1 in terms of type of configuration of the pixels of the second type (charge non-collecting pixel). In this embodiment, rather than applying a predetermined voltage bias, e.g. ground voltage, to make the second pixel function as a charge non-collecting pixel, the photodiode of the pixel is left floating. When a photodiode is left floating, i.e. no specific potential is imposed, and the collected photocharges are not removed from the doped volume (collection volume), the pixel will spontaneously evolve to a condition where the forward current equals the photocurrent so these compensate each other, and the net diode current is zero. Under illumination, this is a weakly forward biased condition, in the dark it is at zero bias. Under such condition, the photodiode will substantially not collect photocharges.

Also in this embodiment, photo-charges 108, 109 drift along the electric field lines to the collecting first doped volumes. These collecting first doped volumes capture charges that normally (if all pixels would have been biased in a same way) would have flown to the currently non-collecting first doped volumes.

Various embodiments exist to make a pixel or photodiode floating. For example, all switches or transistors connecting the photodiode (or photosensitive element in general) can be turned off, i.e. made non-conducting. Alternatively, when these switches or transistors cannot be selectively turned off, the node to which the switches connect can be made floating. Many ways can be devised, which are obvious for the person skilled in the art. Examples with 4T pixels are elaborated below.

Figure 3A:
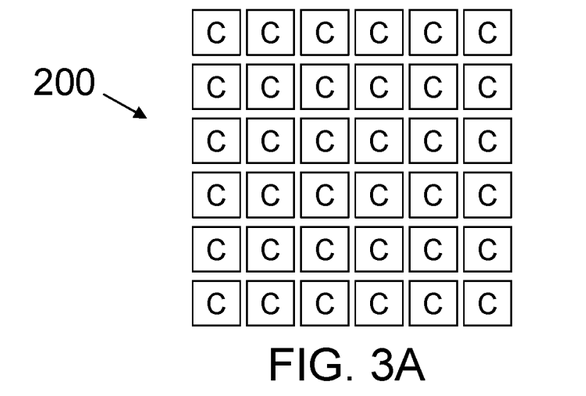
FIG. 3A schematically shows a top view of an example of an array of pixels according to embodiments of the present invention, in which all pixels are configured to be of the first type.

A top view of an array of pixels 200 is illustrated in FIG. 3A. The pixels are all substantially equal. Illustrated in FIG. 3A is a mode in which all pixels are configured to function as charge collecting pixels. This is the "normal" (not "binning") way of operating an array of pixels, wherein substantially all pixels collect photocharges. In the example, all pixels can be configured to function as a pixel of the first type, with a first, higher, charge collecting capability, or as a pixel of the second type, with a second, reduced, charge collecting capability. This, however, is not limiting for the present invention, and in some other embodiments only some of the pixels can be reconfigured to function as a pixel of the second type, while other pixels are fixedly configured to function as a pixel of the first type.

Figure 3B:
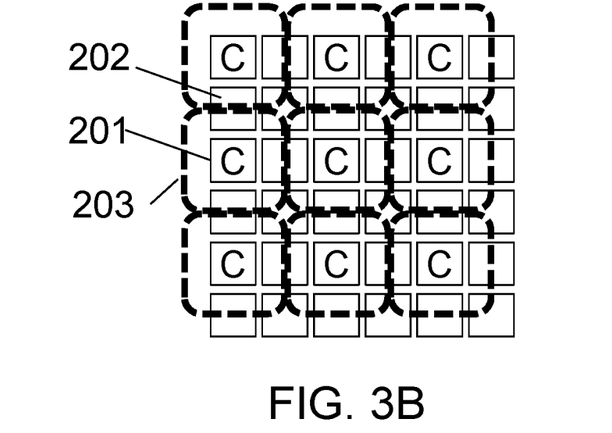
FIG. 3B schematically shows a top view of the array of pixels according to embodiments of the present invention in which some pixels are configured to be of the first type, and some pixels are configured to be of the second type. The dashed lines indicate the area from which the pixels of the first type collect their charge.
Figure 3C:
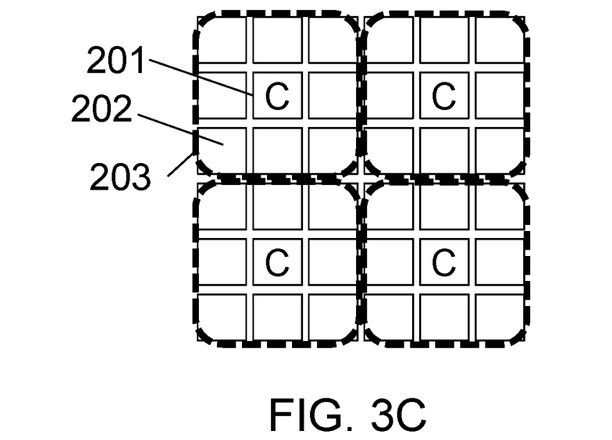
FIG. 3C schematically shows a top view of the array of pixels according to embodiments of the present invention in another implementation, in which some pixels are configured to be of the first type, and some pixels are configured to be of the second type.

The array of pixels as illustrated in FIG. 3A/B/C is configured such that the pixels indicated with C function as pixels of the first type, hence as charge collecting pixels, while the pixels which are shown as blank squares, are configured to function as pixels of the second type, hence charge non-collecting pixels.

The array of pixels illustrated in FIG. 3B comprises at least one charge collecting pixel 201, depicted as a square with a first area of said square, and at least another charge non-collecting pixel 202, depicted as a square, with a second area of said square. The first area and the second area correspond to surface area a pixel takes on the substrate. Typically, the surface area corresponds with the charge collecting volume of the pixel, i.e. the area from which the pixel collects charges. This means that, the larger a pixel, the larger is its physical surface area, but also the larger is its corresponding charge collecting volume. The first area of the charge collecting pixel and the second area of the charge non-collecting pixel may or may not be equal. Another pixel may have a third area which may or may not be equal to the first area of the charge collecting pixel and to the second area of the charge non-collecting pixel. In embodiments of the present invention, due to the configuration of pixels with a reduced charge collecting capability of the charge non-collecting pixels and the higher charge collecting capability of the charge collecting pixels, the charge collecting volume of a charge non-collecting pixel becomes smaller, and the charge collecting volume of a charge collecting pixel becomes larger. FIG. 3B shows a plurality of charge collecting pixels 201 each surrounded by a plurality of charge non-collecting pixels 202, where e.g. the charge collecting volume 203 of the charge collecting pixel 201 is schematically illustrated to be wider than the first area, which corresponds to the pixel's physical area, and covers at least part of the second area of neighboring charge non-collecting pixels 202. In this embodiment, the extension of the charge collecting volume around each of the charge collecting pixels 201 is such that 2×2 binning is realized, i.e. charges which would normally be collected by four pixels (the equivalent of 2×2, but arranged around the charge collecting pixel), are binned and collected by the charge collecting pixel.

The at least one charge collecting pixel 201 may be surrounded by a plurality of charge non-collecting pixels 202. The at least one charge collecting pixel 201 may for instance be surrounded by eight charge non-collecting pixels 202, as for instance illustrated in FIG. 3B and FIG. 3C. The at least one charge collecting pixel 201 may be in between a plurality of charge non-collecting pixels 202, e.g. in a straight line, or in a curved line, or otherwise arranged. The at least one charge collecting pixel 201 may for instance be in between two or more charge non-collecting pixels 202. Charge collecting pixels may be surrounded by or in between other charge collecting pixels. Charge non-collecting pixels may be surrounded by or in between other charge non-collecting pixels.

In a particular embodiment, as illustrated in FIG. 3C, a different configuration of charge collecting and charge non-collecting pixels is applied, such that effectively 3×3 binning is realized. In this case, each charge collecting pixel 201 is surrounded by a plurality of, in the example illustrated eight, charge non-collecting pixels 202. Compared to FIG. 3B, in FIG. 3C there are more charge non-collecting pixels in between every two neighbouring charge collecting pixels. The extension of the charge collecting volume 203 of the charge collecting pixel is larger is FIG. 3C than in FIG. 3B.

The present invention is not limited to the above configurations, and separations between charge collecting and charge non-collecting pixels in an array may be irregular over an array.

Figure 4:
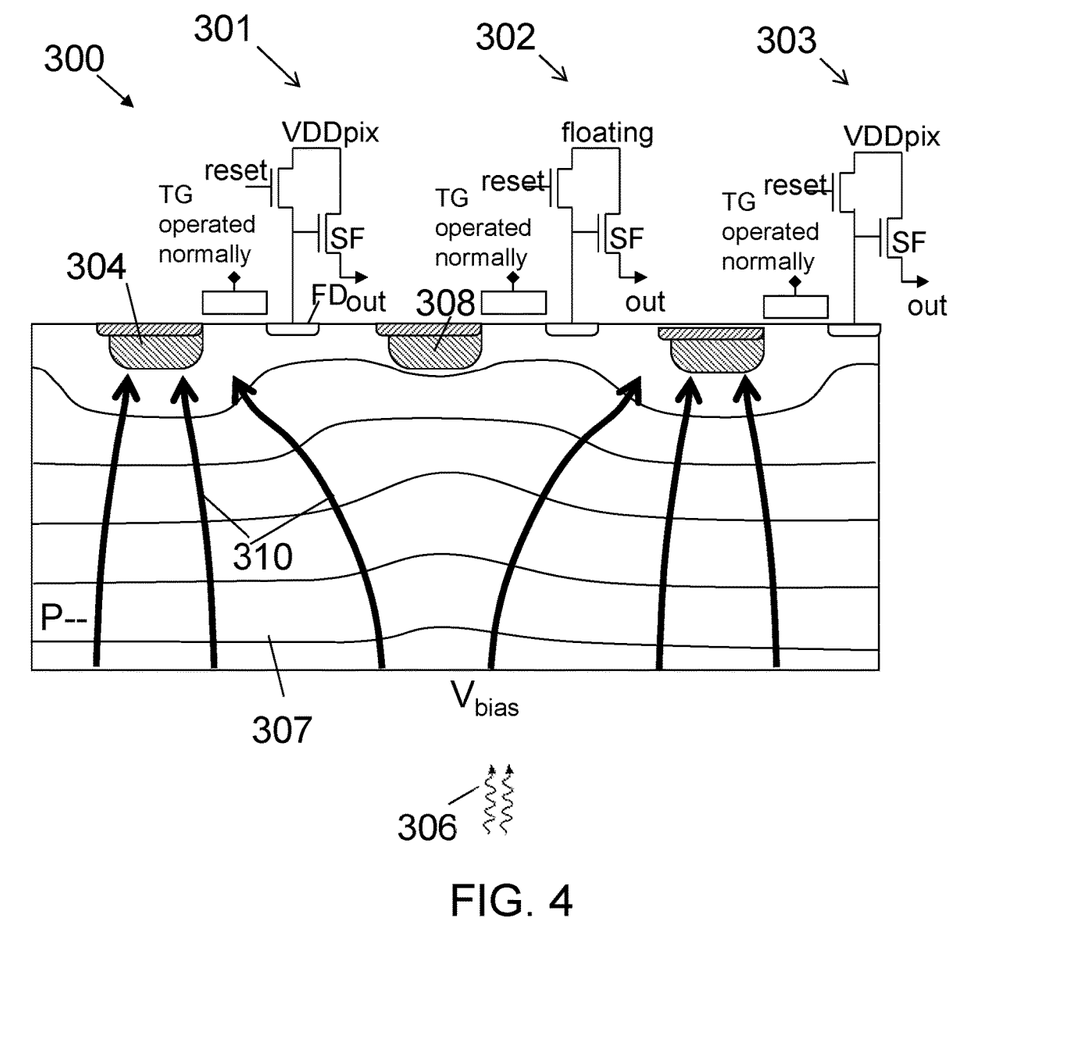
FIG. 4 schematically shows a cross section of an example of an array of 4-transistor pixels according to embodiments of the present invention, wherein pixels configured to function as pixels with a higher charge collecting capability have merged depletion regions, and a pixel is configured to function as a pixel with reduced charge collecting capability by leaving the collecting terminal of the photodiode floating.
Figure 5:
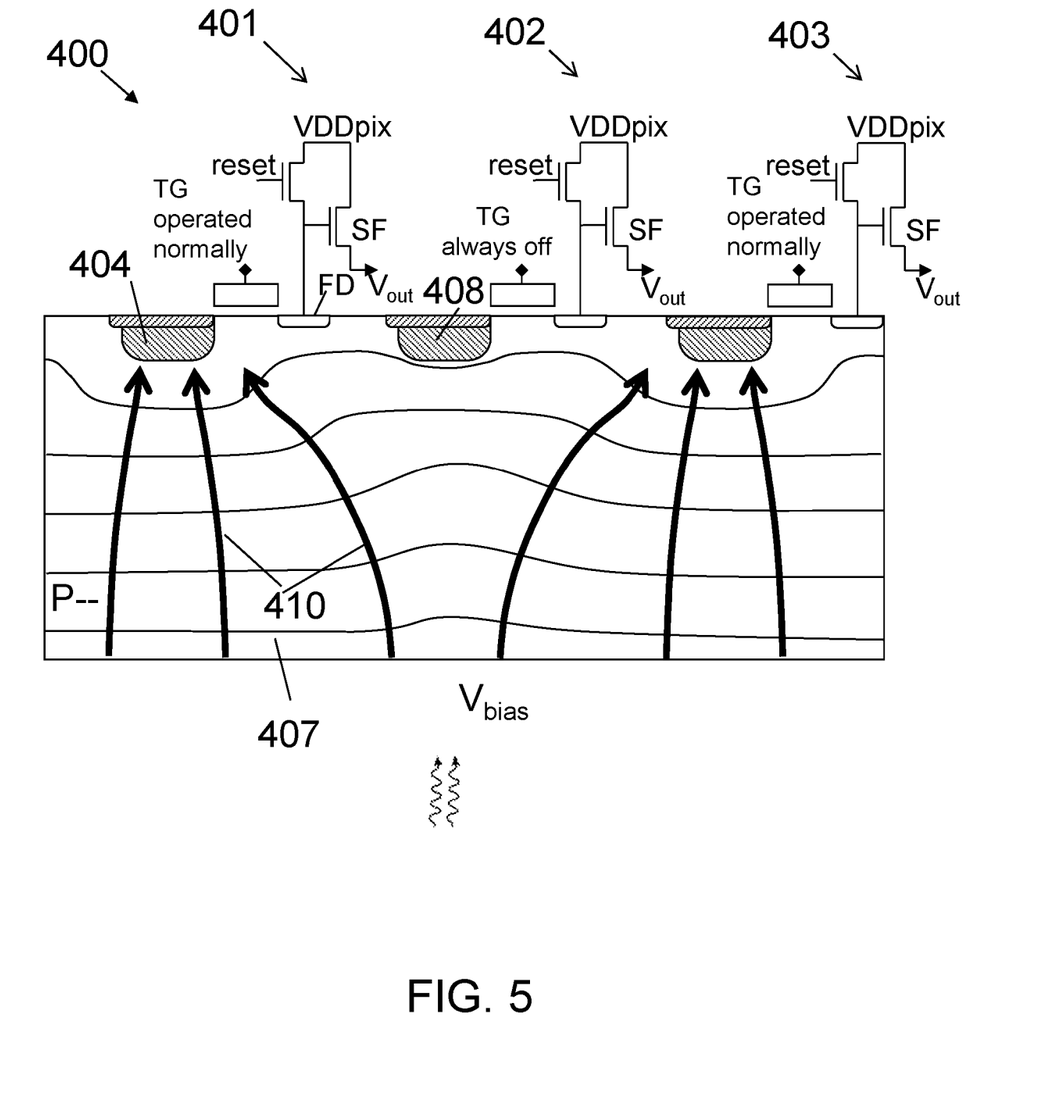
FIG. 5 schematically shows a cross section of an example of an array of 4-transistor pixels according to embodiments of the present invention, wherein pixels configured to function as pixels with a higher charge collecting capability have merged depletion regions, and a pixel is configured to function as a pixel with reduced charge collection capability by leaving the pixel charge collecting volume of the pixel floating.

The array of pixels may comprise a plurality of charge collecting pixels arranged in a 1-dimensional array, or in a 2-dimensional array, for example in a rectangular 2-dimensional array, for instance in a square 2-dimensional array, as illustrated in FIGS. 3A, 3B and 3C. In embodiments of the present invention, as for instance illustrated in FIG. 3C, each of the charge collecting pixels 201 is surrounded by a plurality of charge non-collecting pixels 202. In alternative embodiments, as for instance illustrated in FIG. 3B, most of the charge collecting pixels 201 are surrounded by charge non-collecting pixels 202, but some of the charge collecting pixels, e.g. pixels at the edge of the array, are not completely surrounded by charge non-collecting pixels.

Where FIG. 1 illustrates embodiments of the present invention where both the charge collecting and the charge non-collecting pixels are connected to a fixed but reconfigurable bias, FIG. 2 illustrates other embodiments, where the charge non-collecting pixels are left floating. FIG. 4 and FIG. 5 also illustrate embodiments where charge non-collecting pixels are left floating In embodiments of the present invention, an array of pixels 300 comprises at least a first pixel 301, and a second pixel 302; and illustrated in FIG. 4 is also a third pixel 303. The pixels are intended to function as explained with respect to the first aspect of the present invention, i.e. in the embodiment illustrated the first pixel 301 and the third pixel 303 are configured to function as charge collecting pixels, and the second pixel 302 is configured to function as a charge non-collecting pixel. In the embodiment illustrated in FIG. 4, as an example only, and not limiting the invention, the pixels 301, 302, 303 are of the well-known type of 4-transistor (4T) pixels. A 4T pixel comprises the following transistors: a transfer transistor for transferring collected charge from a photosensitive element towards a charge storage region, for instance a floating diffusion FD, from where the charge can be read out by a readout circuit, a reset transistor for resetting the charge storage region and the photosensitive element, an amplification transistor SF for generating an output signal representative of the amount of charges collected by the photosensitive element and transferred via the transfer transistor towards the charge storage region, and typically also a selection transistor (not shown) for allowing the output signal of a particular pixel to be read out.

A charge collecting pixel in the array of pixels 300 illustrated in FIG. 4 operates as follows. The reset transistor is controlled by a control signal 'reset' applied to the gate thereof, to remove any charges present on the photodiode and the charge storage region, before starting a new cycle of charge collection and readout. Hereto, the supply of the reset transistor is a positive supply voltage VDDpix. Upon radiation 306 impinging on the substrate 307, charges are generated in the substrate, and are, under influence of a suitable electrical field present, as also explained with respect to FIG. 2, collected by the first doped volume 304 of the photosensitive element of the charge collecting pixel. The first doped volume 304 is coupled to the charge storage region, for instanced the floating diffusion capacitive element FD, via the transfer transistor. After radiation has stopped, or whenever a readout is required, the charge collected in the first doped volume 304 is transferred (by suitable actuation of the transfer gate TG of the transfer transistor) to the charge storage region FD, where it is received and temporarily stored until being read out. The charge storage region FD thus provides an in-pixel charge storage area and also acts as a sense node. The moment the collected charge is removed from the first doped volume 304, by charge transfer to the charge storage volume FD, is determined by a control signal applied to the gate of the transfer transistor. The charge storage volume FD is connected to a gate terminal of the amplification transistor SF; the amplification transistor thus senses the magnitude of the voltage signal caused by the charge transferred onto the capacitance of the charge storage volume FD for temporary storage. Being configured as a source-follower FET, the amplification transistor SF functions as a voltage buffer so that substantially no charge is removed from the charge storage volume FD during sensing. The bias current required for biasing the amplification transistor SF is generated outside the pixel circuit, e.g. by a pixel supply VDDpix. As a result of the above, a voltage signal $V_{OUT}$ representative of the accumulated charge (photogenerated during integration) is generated at an output terminal (e.g. source) of the amplification transistor SF.

The operation of a charge non-collecting pixel in the embodiment illustrated in FIG. 4 is similar to the operation of the charge collecting pixels, the difference being that the pixel's supply, e.g. the supply of the reset transistor, is not connected to the positive supply voltage VDDpix, but is left floating. As the photodiode of the second pixel 302 has no path to drain the collected charges, its potential will drop to the level that the diode formed by the substrate 307 and the doped volume 308 goes in a forward bias. The doped volume 308 cannot accept further charges anymore. Electrical field lines 310 deflect from underneath a charge non-collecting pixel towards a charge collecting pixel, as illustrated in FIG. '. This causes the charge collecting pixels to collect more charges generated in the substrate 307 than the charge non-collecting pixels do.

In accordance with embodiments of the present invention, at least one of the pixels of the array of pixels 300 is configurable to function as a charge collecting pixel, and at least another one of the pixels of the array of pixels 300 is configurable to function as a charge non-collecting pixel and as a charge collecting pixel. Which pixels function as charge collecting pixel and which ones function as charge non-collecting pixel, in the embodiment of FIG. 4, is determined by connecting a pixel' supply to the positive supply voltage VDDpix, or leaving a pixel floating. As shown in FIG. 4, the first pixel 301 and the third pixel 303 are connected to the positive supply voltage VDDpix, while the second pixel 302 is left floating.

The pixels 301, 302, 303 in the array of pixels 300 are configurable and preferably each reconfigurable to function as a charge collecting pixel. The reconfigurability allows at some moments in time to use all pixels of the array 300 as charge collecting pixels, e.g. in order to have a high resolution, while at other moments in time, some pixels may be reconfigured to function as charge non-collecting pixels, e.g. in order to obtain a faster readout by binning charges. This does not only hold for the embodiment illustrated in FIG. 4, but is a feature which can be applied to all embodiments of the present invention.

Figure 6:
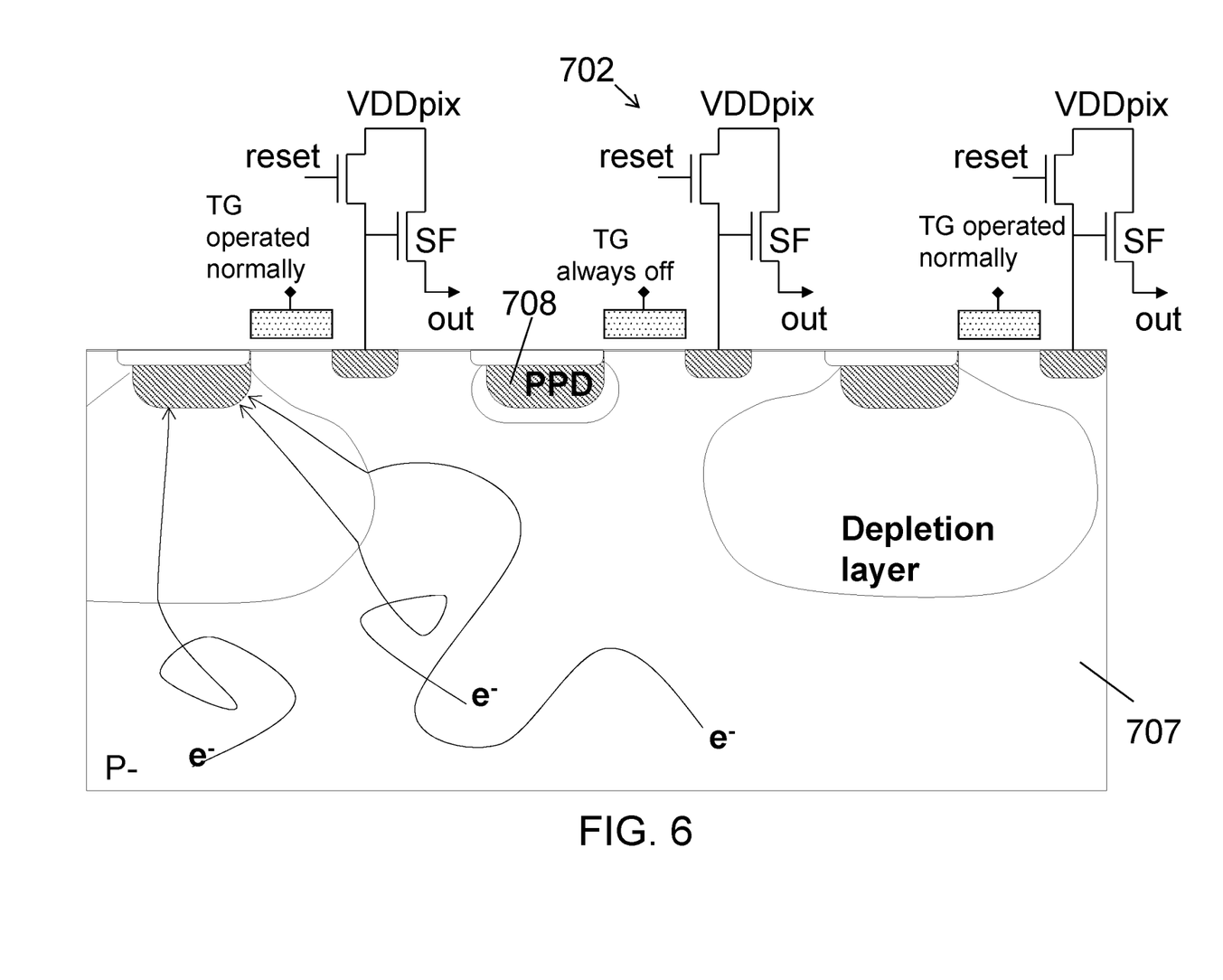
FIG. 6 schematically shows a cross section of an example of an array of 4-transistor pixels according to embodiments of the present invention, wherein pixels configured to function as pixels with a higher charge collecting capability have separated depletion regions, and a pixel is configured to function as a pixel with reduced charge collection capability by leaving the charge collecting volume of the pixel floating.

In an alternative embodiment, an array of pixels 400 is provided, in which, rather than connecting a pixel to the positive power supply to configure it as a charge collecting pixel, or leaving the pixel floating to configure it as a charge non-collecting pixel, all pixels are connected to the positive power supply VDDpix, but the operation of the transfer transistor of the different types of pixels is different. Such embodiment is illustrated in FIG. 5. In this case, the pixels 401, 403 configured to function as charge collecting pixels are operated in a typical, known way, similar as also explained with respect to FIG. 3. The charge collecting pixels collect charges in the doped volume 404, and these charges can be read out via readout circuitry. For pixels configured to function as charge non-collecting pixels the transfer transistor is turned permanently off, by applying a suitable gate signal to its transfer gate. This way, the photosensitive element, e.g. photodiode, of the charge non-collecting pixels is left floating; it will not be reset. The doped volume 408 of the charge non-collecting pixels does not have a path to drain collected charges, and its potential will drop to a level where the doped volume cannot accept any charges anymore. Again, this floating potential of the doped volume 408 causes electrical field lines 410 to deflect from underneath a charge non-collecting pixel towards a charge collecting pixel, as illustrated in FIG. 5. This causes the charge collecting pixels to collect more charges generated in the substrate 307 than the charge non-collecting pixels do.

Where FIG. 1, FIG. 2, FIG. 4 and FIG. 5 illustrate embodiments in which the depletion regions of charge collecting pixels overlap and thus are merged, FIG. 6 illustrates an embodiment in which the depletion regions of charge collecting pixels are separate. The overlapping of depletion regions more easily takes place in lightly doped substrates, e.g. substrates with less than $10^{15}$ dopant atoms/$cm^3$, hence high resistivity substrates, having a resistivity of 500 Ohm·cm or higher. Depletion regions are typically separate in medium doped substrates, with a dopant concentration of about $10^{16}$ to $10^{17}$ dopant atoms/$cm^3$. When depletion regions overlap (touch), the width of the depletion region is maximal and does not substantially change by changing the applied bias VDDpix. Charge collection happens by drift. When depletion regions are separate, their width is substantially sensitive to the applied bias. Charges generated in the substrate 707 outside the depletion regions diffuse through the substrate. When they arrive at a depletion region, they are collected by the doped volume associated with that depletion region. collection happens by diffusion. The charges can arrive at the depletion region of a charge non-collecting pixel, but the chances are bigger that they arrive at the depletion region of a charge collecting pixel, in view of the larger size of such depletion region.

FIG. 6 illustrates an embodiment similar to the embodiment illustrated in FIG. 5, i.e. where the configuration of a pixel to a non-collecting pixel 702 is done by leaving the doped volume 708 of that pixel floating. This is obtained by keeping the transfer transistor of that pixel in a non-conductive state. This embodiment, however, is not limiting for the present invention, and also other embodiments can take place in a situation with separate depletion regions.

In a second aspect, the present invention provides an image sensor 600 comprising at least one array of pixels according to embodiments of the first aspect of the present invention. The image sensor 600 thus comprises at least one pixel configured or configurable to function as a charge collecting pixel for collecting charge generated by radiation impinging on a substrate, and at least one pixel configurable to function as a charge non-collecting pixel and as a charge collecting pixel. The pixels may be configured to be charge collecting or charge non-collecting according to any of the embodiments of the present invention, e.g. by biasing the pixels with a fixed bias voltage; by biasing the pixels with a programmable bias voltage; by biasing some of the pixels with a bias voltage, and by leaving other pixels floating; or by operating some of the photosensitive elements in the usual, well-known way of operation, and by leaving other photosensitive elements floating.

In embodiments of the present invention, the image sensor may be a complementary metal oxide semiconductor (CMOS) image sensor. The image sensor may be adapted for detecting frontside radiation or backside radiation impinging on a substrate in which the charge collecting and charge non-collecting pixels are provided. In most implementations, backside illumination configurations will work better than frontside illumination configurations.

Figure 7:
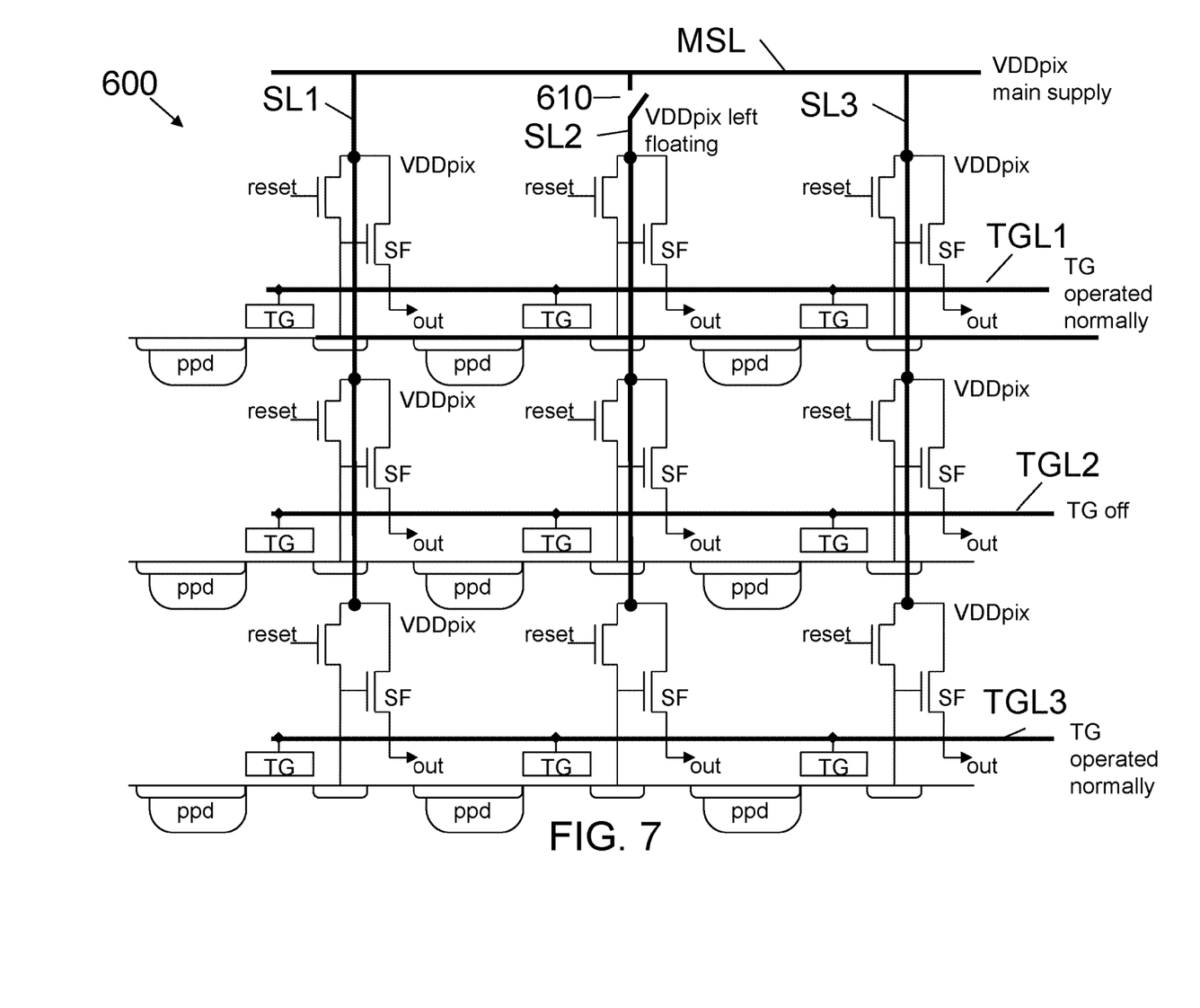
FIG. 7 schematically illustrates an exemplary 3×3 array of 4T pixels in which embodiments of the present invention are implemented.

FIG. 7 illustrates part of an image sensor. In FIG. 7, an array of 3×3 pixels is illustrated, which pixels are provided in a common substrate, and are organized in rows and columns. An array of 3×3 pixels is given as an example only, in practice the array used in the image sensor will most often be much larger and will consist of many more pixels. The pixels illustrated are conventional 4T pixels for ease of illustration, but this is not intended to be limiting for the present invention.

In the image sensor illustrated in FIG. 7, configuration of pixels in arrays as in FIG. 4 and configuration of pixels in arrays as in FIG. 5 or FIG. 6 are combined. The transfer gates TG of transfer transistors of pixels on a same row are connected to a same transfer gate line TGL1, TGL2, TGL3, while transfer gates TG of transfer transistors of pixels on different rows are connected to different transfer gate lines. This allows pixels on a same row to simultaneously transfer their charges towards their charge storing element, e.g. floating diffusion. Pixels on a same column are all connected to a same supply line SL1, SL2, SL3, while pixels on different columns are connected to different supply lines. All supply lines SL1, SL2, SL3 may be connected to a single main supply line MSL, which may be connected to a positive power supply VDDpix. Other lines which connect pixels on a same row or pixels on a same column may also be provided in the image sensor, but are not illustrated because they are irrelevant for explaining the invention, such as for instance reset lines and column lines.

In the embodiment illustrated, the corner pixels, i.e. the pixels at positions 1,1 (row 1, column 1); 1,3; 3,1 and 3,3 are configured to function as charge collecting pixels, and the other pixels are configured to function as charge non-collecting pixels.

The configuration of the pixels as charge non-collecting pixels at the second row is obtained by implementing the embodiment as explained in more detail with respect to FIG. 5 or FIG. 6, namely by leaving the doped volumes forming the collection volume of the photosensitive elements of these pixels floating, by suitably actuating the transfer transistors of the pixels on that row such that they remain in an OFF state. As all the pixels on the second row have their gates connected to the transfer gate line TGL2, this may be obtained by putting a single suitable signal on this transfer gate line TGL2.

In the embodiment illustrated, the configuration of the pixels as charge non-collecting pixels at the second column is obtained by implementing the embodiment as explained in more detail with respect to FIG. 4, namely by leaving the pixels of that column floating, by not connecting (or by disconnecting) them from the positive power supply VDDpix. Hereto, the supply line SL2 of that column may be provided with a switch 610. The fact that FIG. 4 refers to overlapping depletion regions is not limiting for the present invention, and the image sensor 600 could equally well be implemented with charge collecting pixels having separate depletion regions.

For reconfigurability reasons, every supply line SL1, SL2, SL3 may be provided with a switch to enable decoupling of the supply line from, or coupling of the supply line to the main supply line MSL or to the positive power supply VDDpix. Similarly, every transfer gate line TGL1, TGL2, TGL3 may be operated either normally, i.e. with a signal suitable to make transfer transistors conductive, so as to enable them to transfer collected charge to a charge storage volume or not, or they may be operated so as to keep the transfer transistors of the pixels on that row in an OFF state. By providing this reconfigurability, it is possible to use the imager in different modes, e.g. a mode in which all pixels are configured to function as charge collecting pixels, which provides maximal resolution; or in a mode in which some pixels are configured to function as charge collecting pixels and other pixels are configured to function as charge non-collecting pixels, which provides charge binning, with the advantage of increased sensitivity and readout speed, and decreased power consumption.

Figure 8:
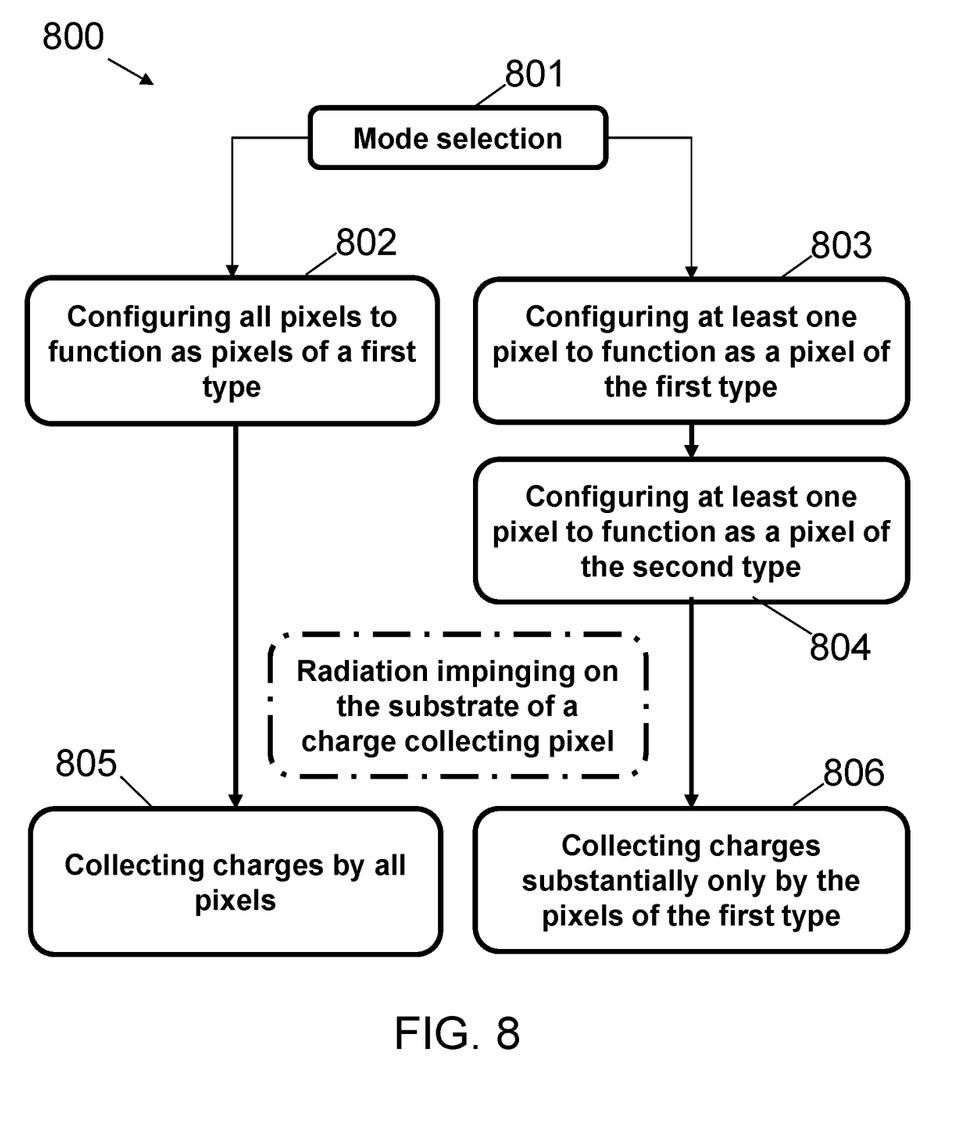
FIG. 8 is a flowchart illustrating a method according to embodiments of the present invention.

In a third aspect, the present invention provides a method 800 for operating an array of pixels in a common substrate in two different modes, a first mode which is a high resolution imaging mode, and a second mode which is a low resolution charge binning mode, as illustrated in FIG. 8. The method comprises selecting 801 any of the first mode or the second mode, and depending on the result of the selection in a first mode configuring 802 all pixels of an array of pixels to function as pixels of a first type with a first, higher charge collecting capability—here also called charge collecting pixels —, or in a second mode, configuring 803 at least one pixel of an array of pixels as a pixel of the first type, and configuring 804 at least another one of the pixels of the array as a pixel of the second type, with a second, reduced, charge collecting capability—here also called a charge non-collecting pixel. When operating the array of pixels, in the first mode, all pixels collect 805 for readout charges generated in the substrate by radiation impinging thereon. In the second mode, substantially only some of the pixels, the charge collecting pixels, collect 806 for readout charges generated in the substrate by radiation impinging thereon.

The configuring of the pixels so as to function as a pixel of the first type or as a pixel of the second type, may be done under control of a voltage bias, wherein said voltage bias is either one of a predetermined voltage bias, a programmable voltage bias or a floating connection.

A method 800 according to embodiments of the third aspect of the present invention may be performed on an array of pixels logically organized in rows and columns. In particular embodiments, the present invention not being limited thereto, the pixels are 4T pixels, in which each pixel has a transfer transistor with a transfer gate, transfer gates of pixels in a same row being electrically connected to a transfer gate control wire, and each pixel having a connection to a main supply via a supply line, wherein a row of pixels is made non-collecting by biasing the transfer gate control wire low e.g. connection to GND for all pixels of that row, and a column of pixels is made non-collecting by leaving the supply line of the pixels on that column floating or connected to GND, as already explained with respect to FIG. 7.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

I claim:

1. An array of pixels comprising at least two pixels in a common substrate,
   wherein each of said at least two pixels comprises a separate photoreceptor charge collecting terminal in the common substrate, the charge collecting terminal comprising a first doped volume, being of a first type selected from n-type and p-type, in the common substrate, being of a second type selected from n-type and p-type different from the first type,
   wherein there is a junction between the first doped volume and the common substrate over which an electric field can be present,
   wherein at least one of said pixels is configured to function as a pixel of a first type with a first, higher, charge collecting capability, for collecting, towards the first doped volume, charges generated by radiation impinging on the substrate and directed by the electric field of the junction, and simultaneously at least another one of said pixels is configurable to function (a)

as a pixel of the first type and (b) as a pixel of a second type, with a second, reduced, charge collecting capability, wherein the at least one pixel of the first type and the at least another one of said pixels have a same voltage bias when the at least another one of said pixels is configured to function as a pixel of the first type.

2. The array of pixels in accordance with claim 1, wherein the photoreceptor charge collecting terminal forms any of a photodiode, a pinned photodiode, a PIN photodiode, a Schottky photodiode, a photogate, a single-photon avalanche photodiode (SPAD), an avalanche photodiode (APD), or a photoresistor.

3. The array of pixels in accordance with claim 1, wherein said at least two pixels are adapted for being configurable as a pixel of the first type or as a pixel of the second type under control of the voltage bias to be applied to the photoreceptor charge collecting terminal, wherein said voltage bias is either one of a predetermined voltage bias, or a programmable voltage bias, or a floating connection.

4. The array of pixels in accordance with claim 1, comprising at least one pixel configured as a pixel of the first type and a plurality of pixels configured as pixels of the second type, wherein said at least one pixel configured as a pixel of the first type is surrounded by a plurality of pixels configured as pixels of the second type.

5. The array of pixels in accordance with claim 4, wherein said at least one pixel configured as a pixel of the first type is surrounded by eight pixels configured as pixels of the second type.

6. The array of pixels in accordance with claim 4, wherein the array of pixels comprises a plurality of pixels arranged in a 1- or 2-dimensional array, wherein each of said pixels configured as a pixel of the first type is surrounded by a plurality of pixels configured as pixels of the second type.

7. The array of pixels in accordance with claim 1, wherein each pixel is configurable to function as a pixel of the first type and as a pixel of the second type.

8. The array of pixels in accordance with claim 1, wherein some of the at least two pixels are fixedly configured to function as a pixel of the first type, and other pixels can be configured to function as a pixel of the first type or a pixel of the second type, depending on their control.

9. The array of pixels in accordance with claim 1, wherein each of the at least two pixels, irrespective of being configured as a pixel of the first type or as a pixel of the second type, are substantially equal.

10. An image sensor comprising an array of pixels in accordance with claim 1.

11. The image sensor in accordance with claim 10, wherein the image sensor is a complementary metal oxide semiconductor (CMOS) image sensor.

12. The image sensor in accordance with claim 10, wherein the image sensor is adapted for detecting backside radiation or frontside radiation.

13. A method of operating an array of pixels having separate photoreceptor charge collecting terminals in a common substrate, in two different modes, the method comprising:

in a first mode, configuring all pixels of the array to function as pixels of a first type with a first, higher, charge collecting capability, for collecting charges generated by radiation impinging on the substrate;

in a second mode, configuring at least one pixel of the array to function as a pixel of the first type, and configuring at least another one of the pixels to function as a pixel of a second type, with a second, reduced, charge collecting capability, so as to perform charge domain binning; and configuring a pixel to function as a pixel of the first type or as a pixel of the second type, by controlling a voltage bias on a collection region of the pixel, wherein the voltage bias is either one of a predetermined voltage bias, or a programmable voltage bias, or a floating connection, wherein, in the first mode, all pixels of the array have the same voltage bias and, in the second mode, said at least one pixel of the array configured to function as the pixel of the first type has said same voltage bias.

14. The method in accordance with claim 13, the method being performed on an array of pixels logically organized in row and columns, each pixel having a transfer transistor with a transfer gate, transfer gates of pixels in a same row being electrically connected to a transfer gate control wire, and pixels on a same column having a connection to a main supply via a column supply line, wherein a row of pixels is configured to function as pixels of the second type by biasing the transfer gate control wire for all pixels of that row such that the transfer transistors are made non-conductive, and wherein a column of pixels is configured to function as pixels of the second type by leaving the supply line of the pixels on that column floating or biased at an intermediate bias between the main supply and a substrate bias.

15. A method of operating an array of pixels in two different modes, the method comprising:

in a first mode, configuring all pixels of the array to function as pixels of a first type with a first, higher, charge collecting capability, for collecting charges generated by radiation impinging on the substrate;

in a second mode, configuring at least one pixel of the array to function as a pixel of the first type, and configuring at least another one of the pixels to function as a pixel of a second type, with a second, reduced, charge collecting capability, so as to perform charge domain binning; and configuring a pixel to function as a pixel of the first type or as a pixel of the second type, by controlling a voltage bias, wherein the voltage bias is either one of a predetermined voltage bias, or a programmable voltage bias, or a floating connection;

wherein the method is performed on an array of pixels logically organized in row and columns, each pixel having a transfer transistor with a transfer gate, transfer gates of pixels in a same row being electrically connected to a transfer gate control wire, and pixels on a same column having a connection to a main supply via a column supply line, wherein a row of pixels is configured to function as pixels of the second type by biasing the transfer gate control wire for all pixels of that row such that the transfer transistors are made non-conductive, and wherein a column of pixels is configured to function as pixels of the second type by leaving the supply line of the pixels on that column floating or biased at an intermediate bias between the main supply and a substrate bias.

* * * * *